US 8,507,324 B2

(12) United States Patent
Nalla et al.

(10) Patent No.: US 8,507,324 B2
(45) Date of Patent: Aug. 13, 2013

(54) FORMING METAL FILLED DIE BACK-SIDE FILM FOR ELECTROMAGNETIC INTERFERENCE SHIELDING WITH CORELESS PACKAGES

(71) Applicants: Ravi K Nalla, San Jose, CA (US); Drew W Delaney, Chandler, AZ (US)

(72) Inventors: Ravi K Nalla, San Jose, CA (US); Drew W Delaney, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/660,095

(22) Filed: Oct. 25, 2012

(65) Prior Publication Data
US 2013/0052776 A1 Feb. 28, 2013

Related U.S. Application Data

(62) Division of application No. 12/755,201, filed on Apr. 6, 2010, now Pat. No. 8,319,318.

(51) Int. Cl.
*H01L 21/58* (2006.01)
*H01L 21/50* (2006.01)

(52) U.S. Cl.
USPC ............. 438/118; 438/125; 257/E21.505; 257/E21.499

(58) Field of Classification Search
None
See application file for complete search history.

(56) References Cited

U.S. PATENT DOCUMENTS

| 5,151,769 | A | 9/1992 | Immorlica et al. |
| 5,353,498 | A | 10/1994 | Fillion et al. |
| 5,355,102 | A | 10/1994 | Kornrumpf et al. |
| 5,497,033 | A | 3/1996 | Fillion et al. |
| 5,527,741 | A | 6/1996 | Cole et al. |
| 5,841,193 | A | 11/1998 | Eichelberger |
| 6,154,366 | A | 11/2000 | Ma et al. |
| 6,159,767 | A | 12/2000 | Eichelberger |
| 6,239,482 | B1 | 5/2001 | Fillion et al. |
| 6,242,282 | B1 | 6/2001 | Fillion et al. |
| 6,271,469 | B1 | 8/2001 | Ma et al. |
| 6,306,680 | B1 | 10/2001 | Fillion et al. |
| 6,396,148 | B1 | 5/2002 | Eichelberger et al. |
| 6,396,153 | B2 | 5/2002 | Fillion et al. |
| 6,423,570 | B1 | 7/2002 | Ma et al. |
| 6,426,545 | B1 | 7/2002 | Eichelberger et al. |

(Continued)

FOREIGN PATENT DOCUMENTS

| JP | 2006-059863 A | 3/2006 |
| WO | 2011/126973 A2 | 10/2011 |
| WO | 2011/126973 A3 | 1/2012 |

OTHER PUBLICATIONS

Ma, et al., "Direct Build-Up Layer on an Encapsulated Die Package", U.S. Appl. No. 09/640,961, Mailed on Aug. 16, 2000, 70 pages.

(Continued)

*Primary Examiner* — Seahvosh Nikmanesh
(74) *Attorney, Agent, or Firm* — Winkle, PLLC

(57) ABSTRACT

Methods of forming a microelectronic packaging structure and associated structures formed thereby are described. Those methods may include forming a cavity in a carrier material, attaching a die in the cavity, wherein a backside of the die comprises a metal filled DBF, forming a dielectric material adjacent the die and on a bottom side of the carrier material, forming a coreless substrate by building up layers on the dielectric material, and removing the carrier material from the coreless substrate.

13 Claims, 5 Drawing Sheets

(56) References Cited

U.S. PATENT DOCUMENTS

| | | |
|---|---|---|
| 6,489,185 B1 | 12/2002 | Towle et al. |
| 6,555,906 B2 | 4/2003 | Towle et al. |
| 6,555,908 B1 | 4/2003 | Eichelberger et al. |
| 6,580,611 B1 | 6/2003 | Vandentop et al. |
| 6,586,276 B2 | 7/2003 | Towle et al. |
| 6,586,822 B1 | 7/2003 | Vu et al. |
| 6,586,836 B1 | 7/2003 | Ma et al. |
| 6,617,682 B1 | 9/2003 | Ma et al. |
| 6,703,400 B2 | 3/2004 | Johnson et al. |
| 6,706,553 B2 | 3/2004 | Towle et al. |
| 6,709,898 B1 | 3/2004 | Ma et al. |
| 6,713,859 B1 | 3/2004 | Ma |
| 6,734,534 B1 | 5/2004 | Vu et al. |
| 6,794,223 B2 | 9/2004 | Ma et al. |
| 6,818,544 B2 | 11/2004 | Eichelberger et al. |
| 6,825,063 B2 | 11/2004 | Vu et al. |
| 6,838,748 B2 | 1/2005 | Ishio et al. |
| 6,841,413 B2 | 1/2005 | Liu et al. |
| 6,888,240 B2 | 5/2005 | Towle et al. |
| 6,894,399 B2 | 5/2005 | Vu et al. |
| 6,902,950 B2 | 6/2005 | Ma et al. |
| 6,964,889 B2 | 11/2005 | Ma et al. |
| 7,067,356 B2 | 6/2006 | Towle et al. |
| 7,071,024 B2 | 7/2006 | Towle et al. |
| 7,078,788 B2 | 7/2006 | Vu et al. |
| 7,109,055 B2 | 9/2006 | McDonald et al. |
| 7,112,467 B2 | 9/2006 | Eichelberger et al. |
| 7,160,755 B2 | 1/2007 | Lo et al. |
| 7,183,658 B2 | 2/2007 | Towle et al. |
| 7,189,596 B1 | 3/2007 | Mu et al. |
| 7,262,444 B2 | 8/2007 | Fillion et al. |
| 7,416,918 B2 | 8/2008 | Ma |
| 7,420,273 B2 | 9/2008 | Liu et al. |
| 7,425,464 B2 | 9/2008 | Fay et al. |
| 7,442,581 B2 | 10/2008 | Lytle et al. |
| 7,476,563 B2 | 1/2009 | Mangrum et al. |
| 7,588,951 B2 | 9/2009 | Mangrum et al. |
| 7,595,226 B2 | 9/2009 | Lytle et al. |
| 7,619,901 B2 | 11/2009 | Eichelberger et al. |
| 7,632,715 B2 | 12/2009 | Hess et al. |
| 7,648,858 B2 | 1/2010 | Tang et al. |
| 7,651,889 B2 | 1/2010 | Tang et al. |
| 7,655,502 B2 | 2/2010 | Mangrum et al. |
| 7,659,143 B2 | 2/2010 | Tang et al. |
| 7,723,164 B2 | 5/2010 | Lu et al. |
| 8,304,913 B2 | 11/2012 | Nalla et al. |
| 8,313,958 B2 | 11/2012 | Swaminathan et al. |
| 8,319,318 B2 | 11/2012 | Nalla et al. |
| 2005/0258537 A1 | 11/2005 | Huang et al. |
| 2006/0125080 A1 | 6/2006 | Hsu |
| 2006/0186536 A1 | 8/2006 | Hsu |
| 2008/0192776 A1 | 8/2008 | Fleming et al. |
| 2008/0315377 A1 | 12/2008 | Eichelberger et al. |
| 2008/0315391 A1 | 12/2008 | Kohl et al. |
| 2009/0007282 A1 | 1/2009 | Tomizuka et al. |
| 2009/0072382 A1 | 3/2009 | Guzek |
| 2009/0079063 A1 | 3/2009 | Chrysler et al. |
| 2009/0079064 A1 | 3/2009 | Tang et al. |
| 2009/0212416 A1 | 8/2009 | Skeete |
| 2009/0294942 A1 | 12/2009 | Palmer et al. |
| 2010/0044855 A1 | 2/2010 | Eichelberger et al. |
| 2010/0047970 A1 | 2/2010 | Eichelberger et al. |
| 2010/0237477 A1 | 9/2010 | Pagaila et al. |
| 2010/0278705 A1 | 11/2010 | Chintalachervu et al. |
| 2011/0101491 A1 | 5/2011 | Skeete et al. |
| 2011/0108999 A1 | 5/2011 | Nalla et al. |
| 2011/0156231 A1 | 6/2011 | Guzek |
| 2011/0215464 A1 | 9/2011 | Guzek et al. |
| 2011/0228464 A1 | 9/2011 | Guzek et al. |
| 2011/0241195 A1 | 10/2011 | Nalla et al. |
| 2011/0241215 A1 | 10/2011 | Sankman et al. |
| 2011/0254124 A1 | 10/2011 | Nalla et al. |
| 2011/0316140 A1 | 12/2011 | Nalla et al. |
| 2012/0001339 A1 | 1/2012 | Malatkar |
| 2012/0009738 A1 | 1/2012 | Crawford et al. |
| 2012/0074581 A1 | 3/2012 | Guzek et al. |
| 2012/0112336 A1 | 5/2012 | Guzek et al. |
| 2012/0139095 A1 | 6/2012 | Manusharow et al. |
| 2012/0139116 A1 | 6/2012 | Manusharow et al. |
| 2013/0023088 A1* | 1/2013 | Nalla et al. ............ 438/107 |

OTHER PUBLICATIONS

International Preliminary Report on Patentability Received for PCT Patent Application No. PCT/US06/047141, Mailed on Oct. 18, 2012, 5 pages.

International Search Report and written Opinion Received for PCT Patent Application No. PCT/US2011/031079, Mailed on Nov. 29, 2011, 8 pages.

* cited by examiner

FORMING METAL FILLED DIE BACK-SIDE FILM FOR ELECTROMAGNETIC INTERFERENCE SHIELDING WITH CORELESS PACKAGES

RELATED APPLICATIONS

The present application is a Divisional of U.S. application Ser. No. 12/755,201 filed Apr. 6, 2010, entitled "FORMING METAL FILLED DIE BACK-SIDE FILM FOR ELECTROMAGNETIC INTERFERENCE SHIELDING WITH CORELESS PACKAGES".

BACK GROUND OF THE INVENTION

As semiconductor technology advances for higher processor performance, advances in packaging architectures may include coreless bumpless build-up Layer (BBUL-C) package architectures and other such assemblies. Current process flows for BBUL-C packages involve building of the substrate on a temporary core/carrier capped with copper foil, which is etched off after the package is separated from the core.

BRIEF DESCRIPTION OF THE DRAWINGS

While the specification concludes with claims particularly pointing out and distinctly claiming certain embodiments of the present invention, the advantages of this invention can be more readily ascertained from the following description of the invention when read in conjunction with the accompanying drawings in which:

DETAILED DESCRIPTION OF THE PRESENT INVENTION

Figure 1A:
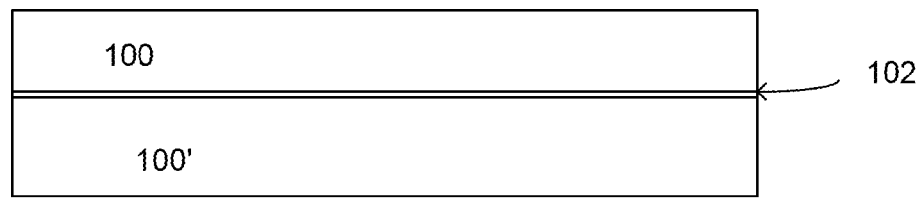
FIGS. 1a-1j represent methods of forming structures according to an embodiment of the present invention.
Figure 1B:
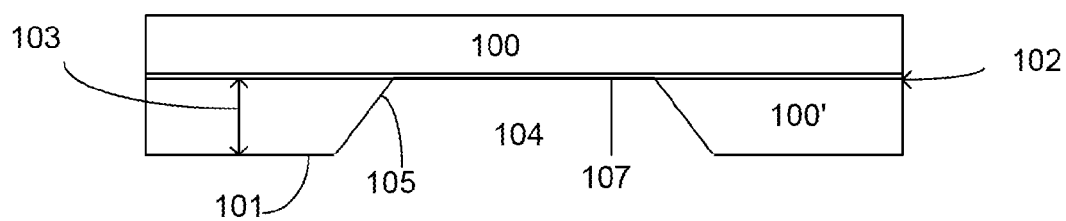

In the following detailed description, reference is made to the accompanying drawings that show, by way of illustration, specific embodiments in which the methods may be practiced. These embodiments are described in sufficient detail to enable those skilled in the art to practice the embodiments. It is to be understood that the various embodiments, although different, are not necessarily mutually exclusive. For example, a particular feature, structure, or characteristic described herein, in connection with one embodiment, may be implemented within other embodiments without departing from the spirit and scope of the embodiments. In addition, it is to be understood that the location or arrangement of individual elements within each disclosed embodiment may be modified without departing from the spirit and scope of the embodiments. The following detailed description is, therefore, not to be taken in a limiting sense, and the scope of the embodiments is defined only by the appended claims, appropriately interpreted, along with the full range of equivalents to which the claims are entitled. In the drawings, like numerals refer to the same or similar functionality throughout the several views.

Methods and associated structures of forming and utilizing a microelectronic structure, such as a package structure, are described. Those methods may include forming a cavity in a carrier material, attaching a die in the cavity, wherein a backside of the die comprises a metal filled die backside film (DBF), forming a dielectric material adjacent the die and on a bottom side of the carrier material, forming a coreless substrate by building up layers on the dielectric material, and removing the carrier material from the coreless substrate. Methods of the embodiments enable the functionalizing of the DBF to create an EMI shield, for example.

FIGS. 1a-1j illustrate embodiments of a method of forming a microelectronic structure, such as a package structure, for example. FIG. 1a illustrates a carrier material 100, 100'. In one embodiment, the carrier material 100 may comprise a multi-layer copper foil that may serve as a carrier, such as a microelectronic die carrier. In other embodiments, the carrier material may comprise any suitable conductive carrier material 100. In an embodiment, the carrier material 100 may comprise two layers, a top layer 100 and a bottom layer 100' as shown, but may comprise one layer or greater than two layers in other embodiments.

In an embodiment, the carrier material 100 may comprise two layers of a conductive material, such as but not limited to copper, for example, that may be separated by a thin etching barrier (stop) layer 102. In an embodiment, the etch stop layer 102 may comprise such materials as nickel, for example, but may comprise any such material that may serve to comprise an etch stop layer to facilitate the stopping of an etch/removal process between carrier layers 100, 100'. In an embodiment, the etch stop layer 102 may serve to aid in the formation of a cavity 104 (FIG. 1b), especially during an etching process, for example. In an embodiment, a thickness 103 of the bottom carrier material layer 100' may be dictated by the thickness and embedded depth of a die to be embedded into the carrier material 100' in a subsequent assembly step.

The cavity 104 may be formed in one layer of the carrier material, such as by removing a portion of the bottom carrier material layer 100'. The cavity 104 may be formed utilizing any suitable removal process, such as an etching process, such as are known in the art. For example, a masking material may be laminated onto the bottom layer of the carrier material 100' and the carrier material 100' may be pattered to form the cavity 104, wherein a die may be subsequently placed therein. The etch stop layer 102 between the carrier material layers 100, 100' may serve as an etch stop for the cavity 104 formation and may define a flat surface to place the die on to. The carrier material 100' with the cavity 104 as formed may comprise a bottom portion 101 an angled portion 105, and a top, flat portion 107, wherein the top portion comprises a portion of the etch stop layer 102.

Figure 1C:
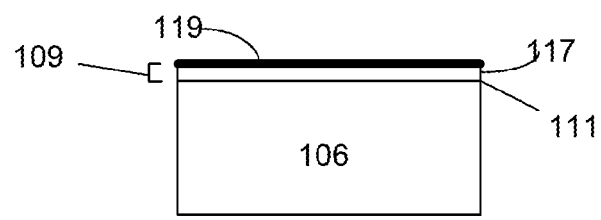

In an embodiment, a die 106, such as a microelectronic die 106, for example, may comprise a die backside film (DBF) 109 (FIG. 1c). In an embodiment, the DBF may comprise a mixture of a suitable adhesive 119 and a metallic particle filler 117. The adhesive 119 can be epoxy based in some cases. The metallic filler 117 may comprise at least one of copper and silver, but other conductive materials may also be used, according to the particular application. A particle size of the metallic filler 117 can be chosen depending on the thickness of the DBF 109 required. In an embodiment, the particle size of the metallic filler 117 may comprise less than about 10 microns.

In addition to the metallic fillers, other non-metallic fillers may also be used to improve the stiffness of the DBF 109 to improve handling of the film and warpage of the die 106 and the final packaged product. In an embodiment, the DBF 109 may also comprise a glass-cloth backbone to improve stiffness. In an embodiment, the die 106 may comprise a thin die 106, and may comprise a thickness of below about 150 microns.

Figure 1D:
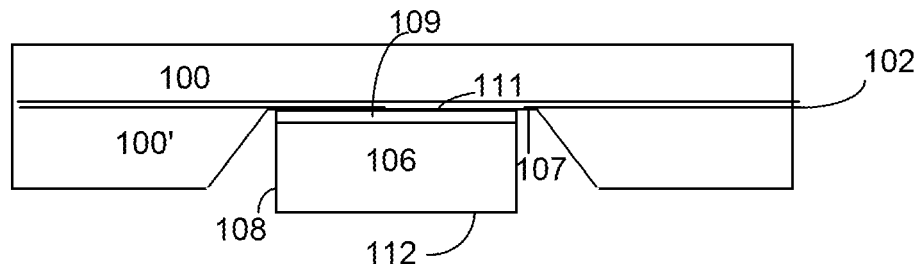

In an embodiment, the die 106 may be attached to the top portion 107 of the carrier material 100' comprising the cavity 104 (FIG. 1d). In an embodiment, the die 106 may comprise at least one sidewall 108, a back side 111 and an active side 112. In an embodiment, the back side 111 of the die 106 comprising the DBF 109 may be disposed on a portion of the etch stop layer 102 within the cavity 104. In some cases, the adhesive film of the DBF 109 and/or an attach process may be used to attach the die 106 within the cavity 104 of the carrier material 100'. In an embodiment, the carrier material 100', which may comprise a copper material in some cases, can be roughened to aid in the attachment of the die 106.

Figure 1E:
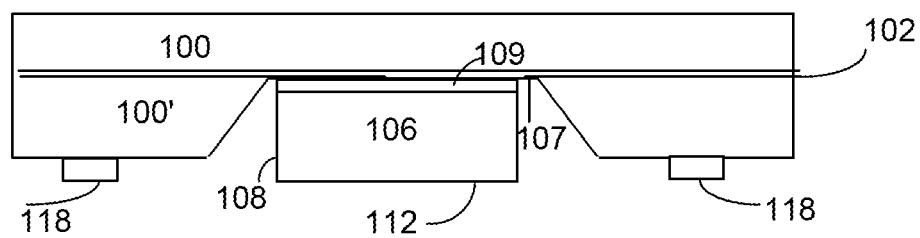

In an embodiment, the adhesive film 119 of the DBF 109 can be used as a permanent part of a final package to protect the backside 111 of the die 106, to provide a surface for marking, and/or to manage any warpage that may occur within the die 106, for example. POP pads/land structures 118 may be formed on the bottom of the carrier material 100', in an embodiment (FIG. 1e).

Figure 1F:
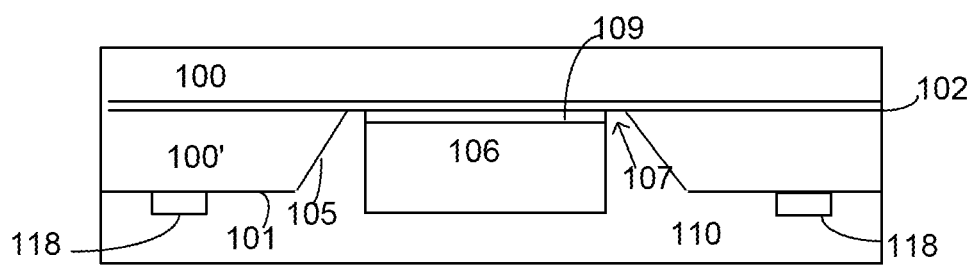

A dielectric material 110 may be formed on the carrier material 100' and adjacent the die 106 and adjacent the PoP land structures 118 and within the cavity 104 of the carrier material 100' (FIG. 1f). In an embodiment, the dielectric material 110 may be formed by a laminating process, for example. The dielectric material 110 may be formed on the bottom portion 101 of the carrier material 100' comprising the cavity 104, on the angled portion 105 of the carrier material 100', and on a portion of the top portion 107 of the carrier material 100' that surrounds the die 106. The dielectric material 110 may provide a level plane for a subsequent build-up process. In an embodiment, the carrier material 100' may be roughened prior to lamination to aid with adhesion to the dielectric material 110.

Figure 1G:
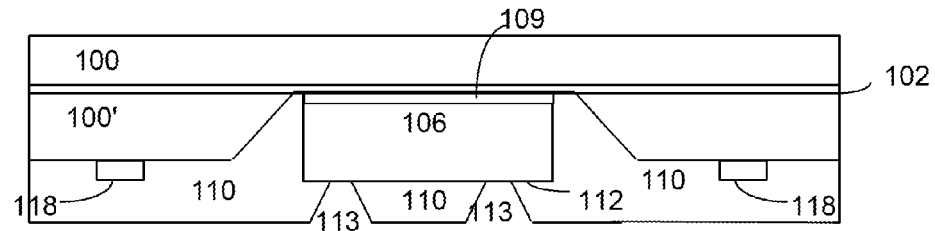
Figure 1H:
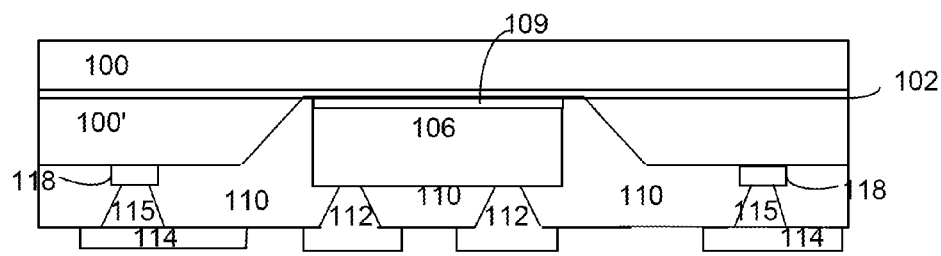
Figure 1I:
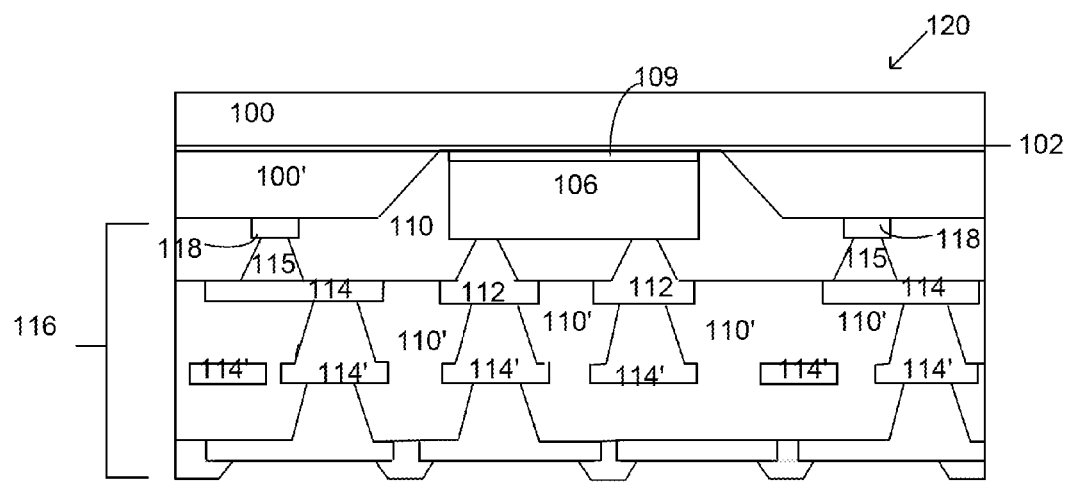

In an embodiment, vias 113 may be formed in the dielectric material 110 in a die area landing of the die 106, wherein die pads, for example copper die pads, may be exposed on the active side 112 of the die 106 (FIG. 1g). In an embodiment, a semi-additive process (SAP) may be used to form die pad interconnect structures 112 on die pads of the die 106 and a first metal layer 114 may be formed on the dielectric material 110 adjacent the die 106 (FIG. 1h). Interconnect structures 115 may be formed to connect with the PoP structures 118. Subsequent layers may then be formed using standard substrate SAP build-up processing, for example, wherein further dielectric layers 110' and metallization layers 114' may be formed upon each other to form a coreless substrate portion 116 of a coreless package structure 120 by utilizing the buildup process (FIG. 1i). In an embodiment, the coreless package structure 120 may comprise a BBUL coreless package structure 120, and the die 106 may be embedded in the coreless package 120.

In an embodiment, when the build-up is complete, the carrier material comprising the top layer of the carrier material 100, the etch stop layer 102 and the bottom layer of the carrier material 100' may be removed (FIG. 1j) from the coreless substrate 120. The DBF 109 may remain on/in the coreless substrate 120, and may be attached/disposed onto the backside 111 of the die 106. The retained DBF 109 may now serve as an EMI shield for the package 120. The PoP structures 118 may remain on/in the package structure 120 as well, since a portion of the PoP structures 118 are embedded in the dielectric material 110 of the coreless substrate 120.

A top surface 123 of the PoP structures 118 may be flush/coplanar with a top surface 121 of the package 120. In an embodiment, the coreless package substrate 120 may further comprise interconnect structures 125, such as ball gird array (BGA) balls, that may be attached to the package structure 120. The coreless package structure 120 may comprise a fillet structure 127 of dielectric material 110 around the die 106, wherein the dielectric material 110 may surround the sidewall 108 and the bottom 112 of the die 106, but wherein the dielectric material 110 is absent on the back side 111 of the die 104, since the DBF 109 is disposed on the backside 111 of the die 106. A portion of the DBF 109 may be embedded in the dielectric 110 of the coreless package 120, and a top side of the DBF may be flush/coplanar with a top surface 128 of the filet structure 127 of the coreless package 120, in an embodiment.

The fillet structure 127 may comprise a portion of the dielectric 110 that may be angled/raised in relation to the planar top portion 121 of the dielectric 110 of the coreless substrate 120. The geometry of this fillet structure 127 can be optimized to provide maximum reliability of the die/package, wherein an angle 129 of the fillet structure 127 may be varied to optimize reliability.

Figure 2:
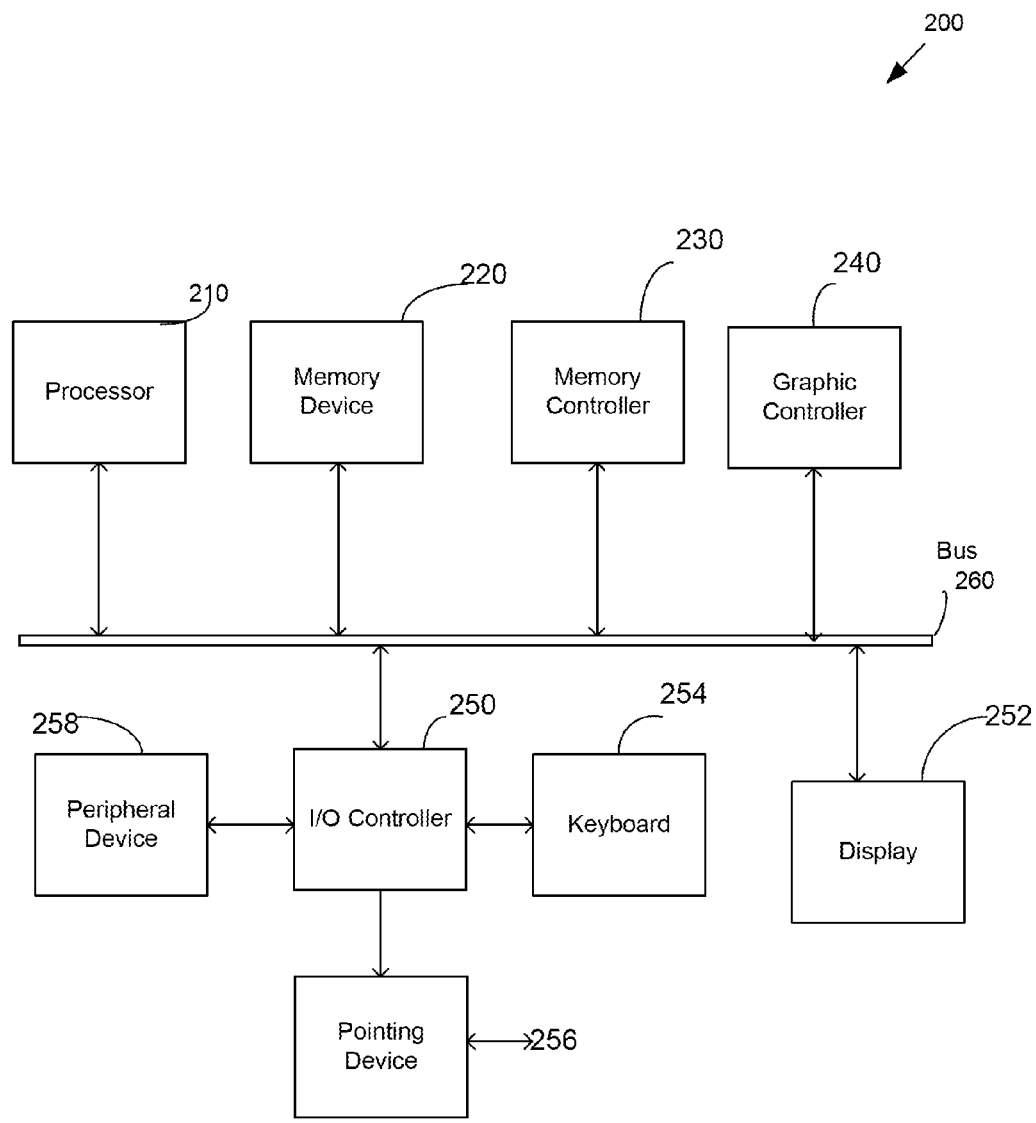
FIG. 2 represents a system according to an embodiment of the present invention.

FIG. 2 shows a computer system according to an embodiment of the invention. System 200 includes a processor 210, a memory device 220, a memory controller 230, a graphics controller 240, an input and output (I/O) controller 250, a display 252, a keyboard 254, a pointing device 256, and a peripheral device 258, all of which may be communicatively coupled to each other through a bus 260, in some embodiments. Processor 210 may be a general purpose processor or an application specific integrated circuit (ASIC). I/O controller 250 may include a communication module for wired or wireless communication. Memory device 220 may be a dynamic random access memory (DRAM) device, a static random access memory (SRAM) device, a flash memory device, or a combination of these memory devices. Thus, in some embodiments, memory device 220 in system 200 does not have to include a DRAM device.

Figure 1J:
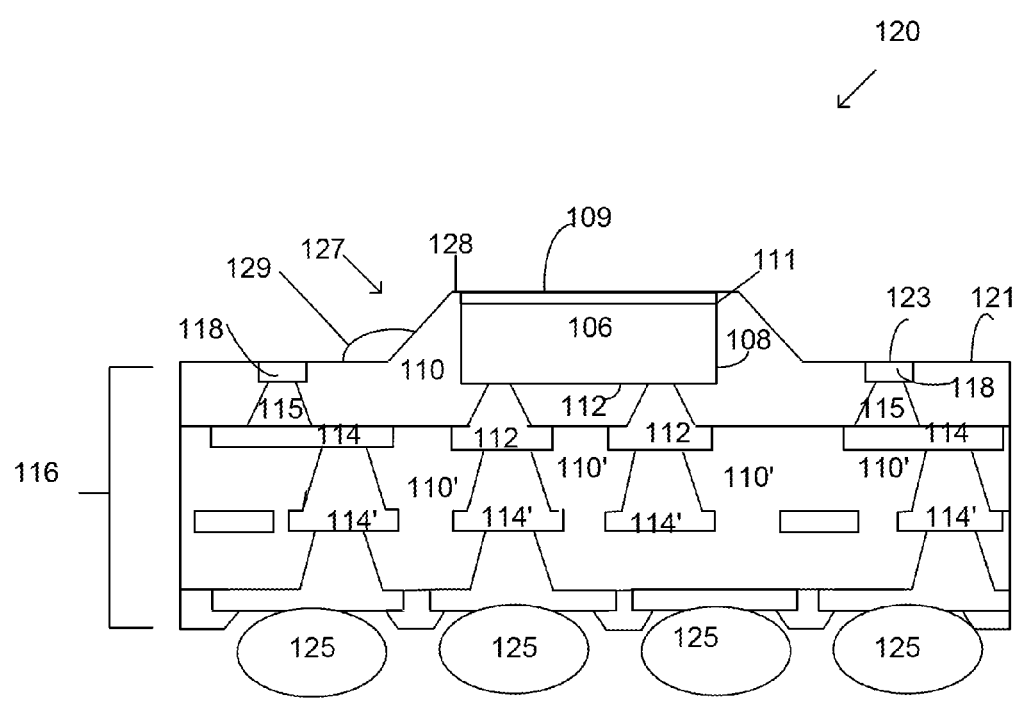

One or more of the components shown in system 200 may be included in/and or may include one or more integrated circuit packages, such as the coreless package structure of FIG. 1j, for example. For example, processor 210, or memory device 220, or at least a portion of I/O controller 250, or a combination of these components may be included in an integrated circuit package that includes at least one embodiment of a structure, such as the various functionalized carrier material structures presented herein, described in the various embodiments.

These elements perform their conventional functions well known in the art. In particular, memory device 220 may be used in some cases to provide long-term storage for the executable instructions for a method for forming packaged structures in accordance with embodiments of the present invention, and in other embodiments may be used to store on a shorter term basis the executable instructions of a method for forming package structures in accordance with embodiments of the present invention during execution by processor 210. In addition, the instructions may be stored, or otherwise associated with, machine accessible mediums communicatively coupled with the system, such as compact disk read only memories (CD-ROMs), digital versatile disks (DVDs), and floppy disks, carrier waves, and/or other propagated signals, for example. In one embodiment, memory device 220 may supply the processor 210 with the executable instructions for execution.

System 200 may include computers (e.g., desktops, laptops, hand-helds, servers, Web appliances, routers, etc.), wireless communication devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like.

Benefits of the embodiments enable a new packaging architecture that can meet design requirements for future mobile/handheld system on a chip (SoC) processors at roughly half the cost of current package architectures. Various embodiments enable the addition of EMI shielding into BBUL-C package structures without added post-package manufacturing cost. EMI shielding may be needed for some BBUL-C products that employ RF or other EMI generating devices containing other silicon devices sensitive to EMI. By functionalizing the DBF by filling it with metallic particles, the filled DBF can be used for electromagnetic interference (EMI) shielding for such RF components.

Although the foregoing description has specified certain steps and materials that may be used in the method of the present invention, those skilled in the art will appreciate that many modifications and substitutions may be made. Accordingly, it is intended that all such modifications, alterations, substitutions and additions be considered to fall within the spirit and scope of the invention as defined by the appended claims. In addition, it is appreciated that various microelectronic structures, such as package structures, are well known in the art. Therefore, the Figures provided herein illustrate only portions of an exemplary microelectronic device that pertains to the practice of the present invention. Thus the present invention is not limited to the structures described herein.

What is claimed is:

1. A method comprising;
    forming a cavity in a carrier material, wherein the carrier material comprises a top layer and a bottom layer separated by an etch stop layer;
    attaching a die in the cavity, wherein a backside of the die comprises a die backside film ("DBF");
    forming Package-on-Package ("PoP") lands on the bottom layer of the carrier material adjacent the die;
    forming a dielectric material adjacent the die and on the carrier material bottom layer;
    forming a coreless substrate by building up layers on the dielectric material; and
    removing the carrier material top and bottom layers and etch stop layer from the coreless substrate.

2. The method of claim 1 further comprising wherein the DBF remains on the die.

3. The method of claim 1 further comprising wherein the DBF comprises an electromagnetic interference ("EMI") shield.

4. The method of claim 1 further comprising wherein the DBF comprises an adhesive, and wherein the adhesive attaches to the bottom carrier layer.

5. The method of claim 1 further comprising removing the carrier material and etch stop layer while they are disposed on the coreless substrate.

6. The method of claim 1 further comprising wherein the DBF comprises metal fillers.

7. The method of claim 6 further comprising wherein the metal fillers comprise at least one of copper and silver, and comprise a particle size of less than about 10 microns.

8. The method of claim 1 further comprising wherein the coreless substrate comprises a portion of a coreless, bumpless, build up layer package.

9. A method comprising;
    forming a cavity in a carrier material;
    attaching a die in the cavity, wherein a backside of the die comprises a metal filled die backside film ("DBF");
    forming Package-on-Package ("PoP") land structures on the bottom layer of the carrier material adjacent the die;
    forming a dielectric material adjacent the die and on a bottom side of the carrier material;
    forming a coreless substrate by building up layers on the dielectric material, wherein vias are formed to connect with the PoP land structures; and
    removing the carrier material from the coreless substrate.

10. The method of claim 9 further comprising wherein the carrier material comprises a top layer and a bottom layer separated by an etch stop layer.

11. The method of claim 9 further comprising wherein the DBF remains attached to the coreless substrate.

12. The method of claim 9 wherein the coreless substrate comprises a portion of a coreless, bumpless, build up layer package.

13. The method of claim 10 further comprising wherein a top surface of the PoP land structure is coplanar with a top surface of the coreless bumpless buildup package.

* * * * *